United States Patent
Souchard et al.

(10) Patent No.: US 8,593,190 B2
(45) Date of Patent: Nov. 26, 2013

(54) FREQUENCY GENERATOR FOR RADIOFREQUENCY EQUIPMENT AND METHOD FOR GENERATING AN OUTPUT SIGNAL

(71) Applicant: Thales, Neuilly sur Seine (FR)

(72) Inventors: Eric Souchard, Cholet (FR); Pierre Bertram, Creil (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 13/846,203

(22) Filed: Mar. 18, 2013

(65) Prior Publication Data

US 2013/0241611 A1 Sep. 19, 2013

(30) Foreign Application Priority Data

Mar. 19, 2012 (FR) ...................................... 12 00817

(51) Int. Cl.
*H03L 7/06* (2006.01)

(52) U.S. Cl.
USPC ........................................ 327/156; 327/147

(58) Field of Classification Search
USPC .................................. 327/147, 156
See application file for complete search history.

(56) References Cited

U.S. PATENT DOCUMENTS

| | | | | |
|---|---|---|---|---|
| 3,064,199 A * | 11/1962 | Brabham | ............................ | 327/6 |
| 3,694,766 A * | 9/1972 | Boelke | ............................ | 331/11 |
| 4,001,714 A * | 1/1977 | Reed | .................................. | 331/4 |
| 4,513,448 A * | 4/1985 | Maher | ............................ | 455/265 |
| 5,343,168 A * | 8/1994 | Guthrie | ............................ | 331/16 |
| 5,781,600 A * | 7/1998 | Reeve et al. | ................... | 375/376 |
| 6,072,427 A * | 6/2000 | McEwan | ........................ | 342/175 |
| 7,616,063 B1 * | 11/2009 | Gamliel | ........................ | 331/1 A |
| 7,675,369 B2 * | 3/2010 | Backes | ............................ | 331/18 |
| 8,009,786 B2 * | 8/2011 | Haralabidis et al. | ............ | 375/376 |
| 8,040,194 B2 * | 10/2011 | Gamliel | ............................ | 331/18 |
| 8,103,010 B2 * | 1/2012 | Maruko et al. | ................... | 381/61 |

OTHER PUBLICATIONS

French Search Report, dated Jan. 21, 2013, which issued during the prosecution of French Patent Application No. 1200817, to which the present application claims priority.

* cited by examiner

*Primary Examiner* — Adam Houston
(74) *Attorney, Agent, or Firm* — Troutman Sanders LLP

(57) ABSTRACT

A frequency generator generating an output signal having a predetermined output frequency, including: a local oscillator generating a reference signal having a reference frequency, and a phase-locked loop, the phase-locked loop provided with a controlled oscillator generating the output signal having the output frequency as a function of the signal at its input, and a comparator providing a signal to the controlled oscillator as a function of a phase and/or frequency comparison of a first comparison signal based on an input signal applied to a first input of the phase-locked loop with a second comparison signal based on the output signal, the frequency generator further including at least one harmonic generator generating, from the reference signal, a harmonic signal including a predetermined harmonic of the reference signal, the frequency generator applying the harmonic signal of one of the harmonic generators to the first input of the phase-locked loop.

11 Claims, 1 Drawing Sheet

FREQUENCY GENERATOR FOR RADIOFREQUENCY EQUIPMENT AND METHOD FOR GENERATING AN OUTPUT SIGNAL

CROSS REFERENCE TO RELATED APPLICATIONS

This application claims priority to French Application No. 12 00817, filed Mar. 19, 2012. The French application is incorporated by reference in its entirety.

FIELD OF INVENTION

The invention relates to a frequency generator for radiofrequency equipment for generating an output signal having a predetermined output frequency.

BACKGROUND

In radiofrequency transmission equipment, the output signals generated by the frequency generator are used to select a channel in the case of a transmission or to assign the equipment to a channel to be used in the case of reception. For example, an output frequency $F_s$ is chosen from a set of predefined discrete frequencies expressed in the form $F_s = k \times \Delta F_s$, with $kmin \leq k \leq kmax$, k an integer and $\Delta F_s$ a frequency chosen as a function of the needs of the application.

In a basic architecture, a frequency generator includes a local oscillator for generating a reference signal. This reference signal, which has a reference frequency Fref, is applied to a phase-locked loop in which the reference signal is divided by a first divider. The signal obtained that has a comparison frequency Fcomp is applied to a first input of the phase comparator. The output signal from the frequency generator is also subject to a frequency division in a second frequency divider and is then applied to a second input of the phase comparator. The comparator provides the result of the comparison between the first input and the second input via a low-pass filter to a voltage-controlled oscillator that generates the output signal with the frequency $F_s$ as a function of its input signal. Generally, such frequency generators are controlled by a controller that chooses the division ratios of the first and second divider as a function of the desired output frequency $F_s$.

Part of the output signal from the voltage-controlled oscillator is amplified for use by a radiofrequency transmission and/or reception chain and another part is returned, as previously described, to the comparator through the second divider.

Such an architecture makes it possible to produce very fine frequency steps $\Delta F_s$ relative to the output frequency $F_s$. Cases exist in which the spectrum delivered by the frequency generator is influenced by parasitic lines, which in particular appear in the case where $F_s$ is close to a harmonic of the reference frequency Fref of the reference signal directly applied to the phase-locked loop or is close to a harmonic of the comparison frequency Fcomp.

In order to offset this drawback, the architecture previously described is often modified by adding an additional circuit between the local oscillator and the phase-locked loop, for example a basic circuit of a direct digital synthesizer (DDS) or a second phase-locked loop. This additional circuit is also controlled by the controller so as to eliminate cases of unfavorable relationships between the reference frequency Fref applied to the phase-locked loop, the comparison frequency Fcomp and the output frequency $F_s$.

Nevertheless, such a solution requires a complex additional circuit that causes significant additional consumption and an unacceptable space requirement for the use of such a frequency generator in portable equipment. Furthermore, the additional circuit for generating a variable reference frequency causes a deterioration of the quality of the signal generated by the additional circuit compared to that of the original reference signal.

SUMMARY

The object of the application is to propose a frequency generator and a method that produce an output signal that is very little disturbed having a low-consumption and compact circuit.

This object is achieved, according to the invention, by a frequency generator for radiofrequency equipment for generating an output signal having a predetermined output frequency, the frequency generator including: a local oscillator to generate a reference signal having a reference frequency, a phase-locked loop, the phase-locked loop being provided with a controlled oscillator generating the output signal having the output frequency as a function of the signal at its input, and a comparator providing a signal to the controlled oscillator as a function of a phase and/or frequency comparison of a first comparison signal based on an input signal applied to a first input of the phase-locked loop with a second comparison signal based on the output signal, the frequency generator also including at least one harmonic generator adapted to generate, from the reference signal, a harmonic signal including a predetermined harmonic of the reference signal, the frequency generator being adapted to apply the harmonic signal of one of the harmonic generators to the first input of the phase-locked loop.

According to advantageous features:
the phase-locked loop is also provided with a first frequency divider, the first frequency divider being adapted to divide the frequency of the input signal to generate the first comparison signal, and/or a second frequency divider, the second frequency divider being adapted to divide the output frequency of the output signal to generate the second comparison signal;
the harmonic generator is adapted to generate an odd harmonic of the reference signal;
the harmonic generator includes a device adapted to generate a plurality of harmonics of the reference signal, in particular a plurality of odd harmonics, for example a generator of a square signal having the reference frequency of the reference signal, and a device for extracting a harmonic adapted to select the predetermined harmonic to be generated by the harmonic generator;
the local oscillator is connected by at least two parallel paths and at least one switch to the first input of the phase-locked loop, the switch(es) being adapted to select one of the paths;
a first switch is connected between the local oscillator and the at least two paths, and a second switch is connected between the at least two paths and the first input of the phase-locked loop;
it is adapted to apply the reference signal having the reference frequency to the first input upon selection of a first path;
at least one second path provided with one of the harmonic generators is such that, when a second path is selected, the harmonic signal is applied to the first input; and/or the frequency generator also includes a selector adapted to choose one of the paths as a function of the output frequency of the output signal to be generated.

Furthermore, this aim is achieved, according to the invention, using a method for generating an output signal having a predetermined output frequency by using a local oscillator to generate a reference signal having a reference frequency and a phase-locked loop, the phase-locked loop being provided with a controlled oscillator generating the output signal having the output frequency as a function of a signal at its input, and a comparator providing a signal to the controlled oscillator as a function of a phase and/or frequency comparison of a first comparison signal based on an input signal applied to a first input of the phase-locked loop with a second comparison signal based on the output signal, the method including: selecting a frequency to be applied to the first input among the reference frequency of the local oscillator and a predetermined harmonic frequency of the reference signal; the generation, from the reference signal, of a harmonic signal having the predetermined harmonic frequency of the reference signal; and the application of the harmonic signal to the first input of the phase-locked loop.

According to advantageous features:

the selection of the frequency to be applied to the first input is done as a function of the output frequency of the output signal.

BRIEF DESCRIPTION OF THE DRAWINGS

Other advantageous features of the present invention will emerge from the description thereof provided below, with reference to the drawings, which illustrates one non-limiting example embodiment in which.

DETAILED DESCRIPTION

Figure 1:
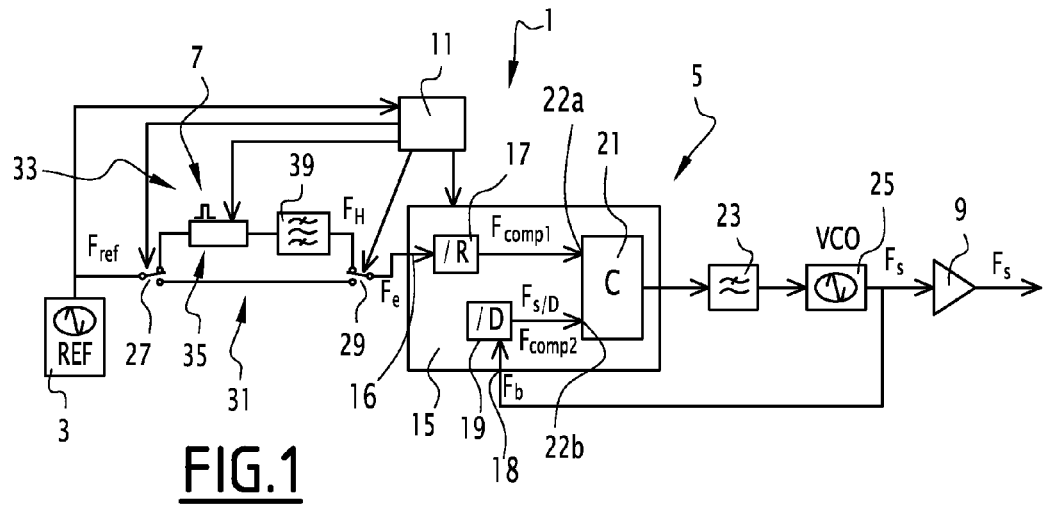
FIG. 1 is a schematic circuit of a frequency generator for a radiofrequency transmission or reception equipment.

The frequency generator 1 of FIG. 1 is used in radiofrequency equipment for a transmission or reception from a radiofrequency channel. The frequency generator 1 generates an output signal having an output frequency $F_s$. The output signal is used, in case of transmission, to select a predetermined channel, or, in case of reception, to assign the equipment to a predetermined channel. The output frequency $F_s$ is chosen from a set of predefined discrete frequencies having a gap $\Delta F_s$ between them expressed in the form of $F_s = k \times \Delta F_s$, with kmin≤k≤kmax, k an integer, and $\Delta F_s$ a frequency chosen as a function of the needs of the application.

The frequency generator 1 includes a local oscillator 3 that generates a reference signal having a reference frequency Fref, a phase-locked loop 5, a harmonic generator 7 adapted to generate a predetermined harmonic of a signal provided to the harmonic generator, an amplifier 9 to amplify the output signal, and a controller 11.

First, the phase-locked loop 5 is outlined, then the circuit including the harmonic generator 7 arranged between the local oscillator 3 and the phase-locked loop 5.

The phase-locked loop 5 including an electronic component 15, for example a chip, provided with a first input 16 connected to a first divider 17, a second input 18 connected to a second divider 19, and a phase or frequency comparator 21.

The first input 16 of the phase-locked loop is connected to the first divider 17 to provide it with an input signal having the input frequency Fe. The first divider 17 is adapted to divide the input frequency Fe to generate, at its output, a first comparison signal having the comparison frequency Fcomp1. The output of the first divider 17 is connected to a first input 22a of the phase comparator 21. The division ratio of the first divider 17 is R. Therefore, Fcomp1=Fe/R.

The second divider 19 is adapted to divide a frequency of a loop signal Fb that is applied to the second input 18 of the phase-locked loop to generate, at its output, a second comparison signal having the comparison frequency Fcomp2. The output of the second divider 19 is connected to a second input 22b of the phase comparator 21. The division ratio D of the second divider 19 is variable. For example, the second divider 19 is a fractional divider. Therefore, Fcomp2=Fb/D.

The phase comparator 21 is adapted to compare the phases and/or frequencies of the signal supplied to its first input 22a and its second input 22b, in particular Fcomp1 and Fcomp2. As a function of the comparison C between Fcomp1 and Fcomp2, the phase comparator 21 is adapted to generate a control voltage signal at its output. The output of the phase comparator 21 is connected to a low-pass filter 23 of the phase-locked loop 5.

The phase-locked loop 5 also includes a voltage-controlled oscillator 25 (VCO). The low-pass filter 23 is connected to the voltage-controlled oscillator 25 to provide the latter with the filtered control signal. The voltage-controlled oscillator 25 is an oscillator wherein the output frequency varies as a function of the voltage of the filtered control signal. The voltage-controlled oscillator 25 is adapted to generate the output signal having the output frequency $F_s$.

The output of the voltage-controlled oscillator 25 is connected on the one hand to the amplifier 9 and on the other hand to the second input 18 of the phase-locked loop 5. The loop signal then corresponds to the output signal, therefore Fb=$F_s$. The output frequency $F_s$ is then divided by the second divider 19 to be applied to the second input 22b of the phase or frequency comparator 21. Then, Fcomp2=$F_s$/D.

The amplifier 9 is adapted to amplify the output signal to provide it to a reception and/or transmission channel of the equipment.

The controller 11 controls the phase-locked loop 5, in particular to set the division ratios R, D of the first divider 17 and the second divider 19 as a function of the desired output frequency $F_s$. The controller 11 is, in another embodiment, a field programmable gate array (FPGA). For example, the controller 11 has stored a table in its memory in which, for each output frequency $F_s$, the input signal to be applied, the division ratio R of the first divider 17 and/or the division ratio D of the second divider 19 are stored. For example, the table is generated upon design of the frequency generator 1.

During the operation of the phase-locked loop, the second comparison signal is locked in on the frequency and phase of the first comparison signal due to the effects of the self-regulation of the phase-locked loop. Therefore, Fcomp1=Fcomp2.

The circuit including the harmonic generator 7 arranged between the local oscillator 3 and the phase-locked loop 5 is explained below.

The frequency generator 1 includes two switches 27, 29 adapted to switch on command from the controller between a first path 31 and a second path 33 that selectively connect the first switch 27 to the second switch 29. The first switch 27 is connected at the output of the local oscillator 3, and the second switch 29 is connected to the first input 16 of the phase-locked loop 5. Therefore, the local oscillator 3 is adapted to provide the reference signal to the first switch 27, which guides it through one of its channels 31, 33 to the second switch 29, then to the first input 16.

The harmonic generator 7 is arranged in a first path 33. The harmonic generator is then adapted of generating a harmonic signal having a single harmonic frequency $F_H$ of the reference signal. The switches 27, 29 are arranged upstream and downstream from the harmonic generator 7 in the direction of the reference signal. The second switch 29 then connects the harmonic generator 7 to the phase-locked loop 5, in particular to its first input 16.

The first path 31 is a direct connection, without processing the signal passing through that path, between the first switch 27 and the second switch 29.

In this way, either the reference signal is provided by the second path 33 to the harmonic generator 7 and the harmonic signal is applied to the first input 16 of the phase-locked loop 5, or the reference signal is directly applied to the first input 16 of the phase-locked loop 5 by the first path 31.

The two switches 27, 29 and the harmonic generator 7 are controlled by the controller 11. Therefore, the controller 11 is adapted to select one of the paths 31, 33. Furthermore, the controller 11 is adapted to start and stop at least a portion of the harmonic generator 7.

The local oscillator 3 is connected to the controller 11 to provide it with the reference signal.

When the frequency generator is designed, the first path 31 and the second path 33 are physically separated to avoid parasitic couplings between them. Furthermore, the local oscillator 3 is well separated from the component 15 of the phase-locked loop 5 to prevent disruptions of the output signal, in particular when a harmonic of the reference signal is used as input signal.

For example, to that end, an isolating wall for the electromagnetic waves is installed between the first path and the second path, as well as between the local oscillator 3 and the component 15.

In one embodiment, a plurality of harmonic generators 7 is arranged in parallel, each in a path. Each harmonic generator generates a particular harmonic. In this embodiment, the switches are adapted to choose one of the paths to apply one of the harmonics or the reference signal to the first input 16 of the phase-locked loop 5. This embodiment allows a larger number of configurations.

The harmonic generator 7 is adapted to be started quickly and stopped when the second path 33 is not used, so as to decrease consumption and the crosstalk problems that could reduce the performance of the frequency generator according to the invention. For example, the controller 11 is adapted to completely or partially stop the harmonic generator 7. The switches 27, 29 do not consume anything when idle. The components to produce the first path 31 and the second path 32 cause a negligible overall cost increase for a radiofrequency equipment.

Figure 2:
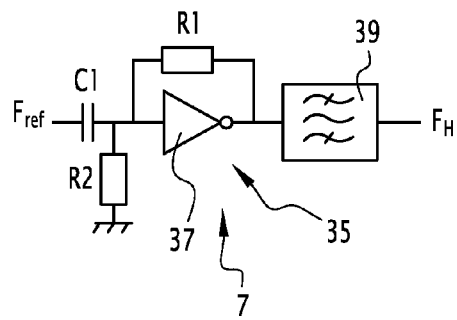
FIG. 2 is a circuit for generating a harmonic of the frequency generator of FIG. 1.

FIG. 2 shows an example of a harmonic generator 7. The harmonic generator 7 generating a single harmonic includes a device for generating a plurality of harmonics 35, 37 and an extraction device 39 for selecting one of the harmonics.

For example, the device for generating a plurality of harmonics is a square signal generator 35 including a logic gate 37, for example a logic inverter 37. The harmonic generator 7 includes a capacitor C1 at its input and is connected to the input of the logic inverter 37. The reference signal is injected at the capacitor C1. A first resistance R1 is connected in parallel with the logic inverter 37. The square signal generator 35 is adapted to create a square signal. The spectrum of an ideal square signal includes only odd harmonics. However, the real spectrum also includes even harmonics. An optional resistance R2 is adapted to perfect the cyclic ratio of the square signal while erasing or minimizing, as much as possible, the power of the even harmonics to obtain as pure a spectrum as possible. When the harmonic generator is stopped or turned off, its active components, here the logic gate 37, are turned off.

The output of the generator of the square signal 35 is connected to the extraction device 39, here a low-pass filter 39 adapted to select one of the generated harmonics. For example, the low-pass filter is centered on the frequency of the harmonic to be selected.

In one embodiment, instead of a fixed low-pass filter 39, a variable low-pass filter 39 is used that is locked in by the controller 11. In this way, the frequency generator has a larger number of frequency choices to be applied to the first input 16 of the phase-locked loop 5.

The operation of the frequency generator 1 is explained below.

The frequency generator 1 is adapted to choose a value of Fcomp1 and Fe such that $F_s$ is not close to a multiple of those frequencies. Therefore, the case where $F_s$ is approximately equal to k×Fe or $F_s$ is approximately equal to l×Fcomp1, with k,l, integers must be avoided.

Generally, the output frequency $F_s$ of the output signal of the frequency generator 1 is:

$F_s$=Fcomp1×D, with Fcomp1=Fe/R and D=N+Frac/Mod, with Fe being the input frequency of the input signal of the phase-locked loop, R being the division ratio applied to the input frequency Fe by the first divider 17, and N and Frac/Mod respectively being the whole portion and the fractional portion of the division ratio of the second divider 19 applied to the output signal having the frequency $F_s$. Fcomp1 is the frequency at which the comparison is done, i.e., the frequency of the first comparison signal.

For example, to change the output frequency, the division ratio D of the second divider 19 is modified. The distance between two adjacent discrete frequencies to be generated then depends on the frequency Fcomp1 of the first comparison signal of the reference frequency and, in the case of a fractional division, the denominator Mod of the fractional portion of the division ratio D of the second divider 19. For example, in the case of a whole division ratio D, the distance between two adjacent discrete frequencies is $\Delta F_s$=Fcomp1. In the case of a fractional division ratio D (D=N+Frac/Mod), the distance between two adjacent discrete frequencies to be generated is $\Delta F_s$=Fcomp1/Mod.

The distance $\Delta F_s$ is, in the described embodiment, very fine with respect to the output frequency $F_s$. For example, $\Delta F_s$ is approximately 25 kHz for an output frequency $F_s$ of several hundred MHz.

Figure 3:
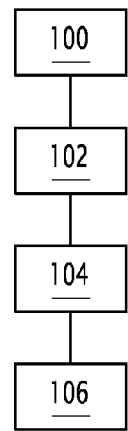
FIG. 3 shows a flowchart of a method according to an example of the invention.

Below, one example is provided using the flowchart of FIG. 3 for the case where the frequency generator 1 must synthesize a frequency $F_s$ approximately equal to 10·Fref. The frequency to be synthesized $F_s$ is determined in step 100.

The exact frequency $F_s$ will be $F_s$=10·Fref+Δf, with Δf=n× $\Delta F_s$ close to 0 relative to $F_s$ (n being an integer), as $F_s$ is much greater than $\Delta F_s$. When the output frequency is close to a multiple of Fref, the spectrum will be polluted by lines at $F_s$±Δf.

The controller decides in step 102 whether the reference signal having the reference frequency Fref is directly applied to the first input 16 of the phase-locked loop 5 or if a harmonic of the reference signal generated by the harmonic generator 7 is applied to the first input 16 of the phase-locked loop 5.

In the case of the example, the controller 11 decides to apply an odd harmonic to the reference frequency Fref of the local oscillator 3, for example the third harmonic. Then, $F_H=3 \cdot Fref$.

Subsequently, in step 104, the controller 11 commands the switches 27, 29 such that the reference signal of the local oscillator 3 is applied to the harmonic generator 7. Furthermore, the controller starts the harmonic generator 7. During the operation of the harmonic generator 7, the logic inverter 37 creates a square signal including the odd harmonics of the reference signal. Therefore, the signal at the output of the inverter 37 includes harmonic lines at frequencies $F_c=(m+1) \cdot Fref$, with m an integer. Then, the square signal is filtered by the low-pass filter 39, which is, for example, centered on the third harmonic. The harmonic signal at the output of the harmonic generator 7 then has a frequency $F_H=3 \cdot Fref$. The input signal at the phase-locked loop 5 therefore has a frequency $Fe=3 \cdot Fref$.

In step 106, the division ratios R, D for the first divider 17 and for the second divider 19 are applied in a phase-locked loop 5. In one embodiment, the division ratio of the first divider 17 is an integer, for example 2. Therefore, the controller 11 chooses the division ratios R, D of the first and second divider as a function of the desired output frequency $F_s$, for example from values stored in the table in the memory of the controller 11.

The frequency of the first comparison signal at the first input 22a of the first comparator 21 is $Fcomp1=Fe/2=3 \cdot Fref/2$, using R=2.

In that case, it is possible to calculate the deviation between the output frequency $F_s$ and the closest harmonic of Fe:

$$F_s=10 \cdot Fref+\Delta f=10 \cdot Fe/3+\Delta f=3 \cdot Fe+\tfrac{1}{3} \cdot Fe+\Delta f.$$

The deviation between the output frequency $F_s$ and the closest harmonic of the input frequency Fe used is then $\tfrac{1}{3}Fe+\Delta f$.

Without applying the harmonic generator, the deviation between the closest harmonic of the input frequency Fe=Fref could be $\Delta f$, as $Fs=10\Delta Fref+\Delta f=10 \cdot Fe+\Delta f$.

Therefore, the deviation between the closest harmonic of the input signal used and the frequency of the output signal is increased considerably.

The frequency response of the phase-locked loop (PLL) behaves like a low-pass, the cutoff frequency being much lower than Fe, for example less than Fe/3. This effect naturally attenuates the lines having a distance greater than $\tfrac{1}{3}Fe+\Delta f$ from $F_s$.

Likewise, it is possible to calculate the deviation between the output frequency $F_s$ and the closest harmonic of Fcomp1:

$$F_s=10 \cdot Fref+\Delta f=10.2 \cdot Fcomp1/3+\Delta f=7 \cdot Fcomp1+(-\tfrac{1}{3} \cdot Fcomp1+\Delta f), \text{ with } Fref=2 \cdot Fcomp\tfrac{1}{3}$$

Therefore, the deviation between $F_s$ and the closest harmonic of the comparison frequency Fcomp1 used is $\tfrac{1}{3} \cdot Fcomp1-\Delta f$. Without using the harmonic generator, the deviation between the closest harmonic of the comparison frequency Fcomp1 and the output frequency $F_s$ would only be $\Delta f$, as $F_s=10 \cdot Fref+\Delta f=20 \cdot Fcomp1+\Delta f$.

This example demonstrates that the direct application of the frequency of the reference oscillator leads to an unfavorable case. The use of an odd harmonic of that same frequency resolves the problem.

If the controller decides in step 102, as a function of the desired output frequency $F_s$, that the reference signal having a reference frequency Fref is directly applied to the first input 16 of the phase-locked loop 5, in step 104 the controller 11 commands the switches 27, 29 to select the first path 31. Furthermore, the controller turns off the harmonic generator 7.

Then, in step 106, the division ratios R, D for the first divider 17 and the second divider 19 are applied.

According to the invention, the selection of the path 31, 33 is done by the controller 11, which switches the correct path 31, 33 as a function of the desired output frequency $F_s$.

One advantage of this approach lies in the fact that no significant deterioration of the noise on the reference frequency of the local oscillator 3 is introduced. The frequency generator and the method according to the invention therefore make it possible to resolve the problems of lines on the synthesized frequency without deteriorating the overall performance of the noise of the frequency generator.

The invention claimed is:

1. A frequency generator for radiofrequency equipment for generating an output signal having a predetermined output frequency, the frequency generator comprising:
   a local oscillator to generate a reference signal having a reference frequency,
   a phase-locked loop, the phase-locked loop provided with a controlled oscillator generating the output signal having the output frequency as a function of the signal at its input, and
   a comparator providing a signal to the controlled oscillator as a function of at least one of a phase or frequency comparison of a first comparison signal based on an input signal applied to a first input of the phase-locked loop with a second comparison signal based on the output signal,
   wherein the frequency generator also includes at least one harmonic generator adapted to generate, from the reference signal, a harmonic signal including a predetermined harmonic of the reference signal, the frequency generator being adapted to apply the harmonic signal of one of the harmonic generators to the first input of the phase-locked loop.

2. The frequency generator according to claim 1, wherein the phase-locked loop is also provided with a first frequency divider, the first frequency divider being adapted to divide the frequency of the input signal to generate at least one of the first comparison signal, or a second frequency divider, the second frequency divider being adapted to divide the output frequency of the output signal to generate the second comparison signal.

3. The frequency generator according to claim 1, wherein the harmonic generator is adapted to generate an odd harmonic of the reference signal.

4. The frequency generator according to claim 1, wherein the harmonic generator comprises an harmonic device adapted to generate a plurality of harmonics of the reference signal, in particular a plurality of odd harmonics, for example a generator of a square signal having the reference frequency of the reference signal, and
   an extraction device extracting a harmonic adapted to select the predetermined harmonic to be generated by the harmonic generator.

5. The frequency generator according to claim 1, wherein the local oscillator is connected by at least two parallel paths and at least one switch to the first input of the phase-locked loop, the switch being adapted to select one of the paths.

6. The frequency generator according to claim 5, wherein a first switch is connected between the local oscillator and the at least two paths, and a second switch is connected between the at least two paths and the first input of the phase-locked loop.

7. The frequency generator according to claim 5, wherein it is adapted to apply the reference signal having the reference frequency to the first input upon selection of a first path.

8. The frequency generator according to claim 5, wherein at least one second path provided with one of the harmonic generators is such that, when a second path is selected, the harmonic signal is applied to the first input.

9. The frequency generator according to claim 5, further comprising a selector adapted to choosing one of the paths as a function of the output frequency of the output signal to be generated.

10. A method for generating an output signal having a predetermined output frequency by using a local oscillator to generate a reference signal having a reference frequency and a phase-locked loop, the phase-locked loop being provided with a controlled oscillator generating the output signal having the output frequency as a function of a signal at its input, and a comparator providing a signal to the controlled oscillator as a function of a phase and/or frequency comparison of a first comparison signal based on an input signal applied to a first input of the phase-locked loop with a second comparison signal based on the output signal, the method comprising the steps of:
   selecting a frequency to be applied to the first input among the reference frequency of the local oscillator and a predetermined harmonic frequency of the reference signal;
   generating, from the reference signal, a harmonic signal having the predetermined harmonic frequency of the reference signal; and
   applying the harmonic signal to the first input of the phase-locked loop.

11. The method according to claim 10, wherein the selecting of the frequency to be applied to the first input is done as a function of the output frequency of the output signal.

* * * * *